United States Patent [19]
Dibble et al.

[11] Patent Number: 5,316,788
[45] Date of Patent: May 31, 1994

[54] APPLYING SOLDER TO HIGH DENSITY SUBSTRATES

[75] Inventors: Eric P. Dibble, Endicott; Steven L. Hanakovic, Vestal; Voya R. Markovich, Endwell, all of N.Y.; Daniel S. Niedrich, Kasson, Minn.; Gary P. Vlasak, Owego, N.Y.; Richard S. Zarr, Apalachin, N.Y.; Richard C. Senger, Vestal, N.Y.

[73] Assignee: International Business Machines Corporation, Armonk, N.Y.

[21] Appl. No.: 736,380

[22] Filed: Jul. 26, 1991

[51] Int. Cl.$^5$ ............................................. B05D 1/00
[52] U.S. Cl. ................................... 427/98; 427/96; 427/443.1; 204/192.1; 204/192.11; 204/192.17
[58] Field of Search ................. 427/96, 98, 443.1; 204/192.1, 192.11, 192.17

[56] References Cited

U.S. PATENT DOCUMENTS

| | | | |
|---|---|---|---|
| 3,359,132 | 12/1967 | Wittmann | 427/96 |
| 3,458,925 | 8/1969 | Napier et al. | |
| 3,705,457 | 12/1972 | Tardoskegyi | 427/96 |
| 3,894,329 | 7/1975 | Niemirovich | |
| 4,084,022 | 4/1978 | Fratz et al. | |
| 4,273,859 | 6/1981 | Mones et al. | |
| 4,389,771 | 6/1983 | Cassidy | 427/96 |
| 4,487,654 | 12/1984 | Coppin | |
| 4,706,167 | 11/1987 | Sullivan | 427/96 |
| 5,011,658 | 4/1991 | Niedrich | |

FOREIGN PATENT DOCUMENTS 196196  8/1989  Japan ..................... 427/96

OTHER PUBLICATIONS

Tadahiro Nomura, English Translation of Japanese Patent 196196.
Principles of Electronic Packaging, Ed., Seraphim et al., published 1989, Chapter 19, pp. 577–610 by Senger et al.
Microelectronics Packaging Handbook, Ed., Trummala et al., published 1989, chapter 1, pp. 16 and 42–43, Chapter 11, pp. 779–780, 803 and 814 ff and Chapter 15, p. 1041.
IBM TDB vol. 29, No. 2, Jul. 1986, "Electrolytic Process for Substrate Manufacturing", by Dunkel et al.
IBM TDB vol. 29, No. 7, Dec. 1986, "Immersion Wave Soldering Flux" by Rott et al.
IBM TDB vol. 24, No. 6, Nov. 1981, "Penetrating Low Temperature Immersion Tin", by Albrecht et al.
IBM Journal of Research & Development, vol. 26, No. 3, May, 1982, pp. 379–382, "Immersion Wave Soldering Process", by Getten et al.

*Primary Examiner*—Shrive Beck
*Assistant Examiner*—Vi Duong Dang
*Attorney, Agent, or Firm*—Judith D. Olsen; Lawrence R. Fraley

[57] ABSTRACT

Process is described for applying large quantities of solder to small areas, such as the lands in a high density card, to which it is intended to surface mount electronic devices or directly attach circuitized chips. The land area is temporarily extended by depositing a relatively thin layer of metal beyond the perimeter of the land, wave soldering to deposit excess solder on the extended land region, and reflow, whereby the thin layer of metal dissolves into the solder, causing the solder to retract to the dimensions of the original land. Because the volume of solder is increased, the strength and reliability of the solder joint is greatly improved.

10 Claims, 7 Drawing Sheets

POOR JOINT
LOW SOLDER
VOLUME

APPLYING SOLDER TO HIGH DENSITY SUBSTRATES

BACKGROUND OF THE INVENTION

1. Field of the Invention

The present invention generally relates to printed circuit cards and boards and processes for mounting devices on the major surfaces thereof.

More particularly, the present invention relates to a method of making reliable connections between lands, aka pads, on at least one of the major surfaces of a carrier, which may be a circuit board, card, flexible substrate or circuitized semiconductor chip or wafer, and a surface mounted device, and the resulting product. The mounted device may include resistors, capacitors, and the like or may itself comprise a board, card, flexible substrate or circuitized semiconductor chip or wafer.

The method and product of the present invention is especially useful in the field known as High Density Circuitry, and the uniqueness of the product especially evident therein. However, it may be used to advantage in any situation in which it is necessary to increase the volume of solder in a discrete area. Because the temperatures and chemicals involved in processing are nondestructive, the method and product are amenable to joining by wave soldering to and between lands on substrates comprising organic materials as well as inorganic and semiconductor materials.

2. Background Art

Printed circuit devices have been used in the electronics industry for many years and in a variety of environments. The flat substrate of insulating material may be thin or thick, and is typically comprised of layers of dielectric material such as epoxy resin, polyimide, polyester and the like, which may be reinforced with fibers and filled with heat conductive, electrically nonconductive particles. Each layer may bear circuitry traces, commonly comprised of copper, which may terminate in small eyelet or square shaped conductive regions called lands. Lands may be provided with through holes and vias in order to interconnect laminated layers within the laminated composite. External lands also provide sites on which to mount components such as resistors, capacitors, integrated circuits and the like.

Over the years, attention has been drawn to printed circuit devices of increasingly smaller and denser physical dimensions combined with increasingly greater functional capacity. The supercomputers being planned now for future manufacture as well as miniaturized electronic devices will depend on the reliable performance of electronic packages of unprecedented complexity as well as unprecedented functionally and dimensionally demanding tolerances. The fabrication of these complex and demanding structures requires the use of many new materials and processes and presents a host of new problems.

Surface mount is a technology which can be used to produce improved packaging efficiency and performance. In surface mount technology (SMT) components with input/output (I/O) leads are typically soldered to lands on the surface of a carrier. A further improvement to the efficient use of carrier real estate is seen when the components are mounted on both major surfaces of the carrier. As discussed in Chapter 19, p. 577 of *Principles of Electronic Packaging*, Ed. Seraphim et al. 1989, in electronic packaging when a silicon chip is attached to a metallized substrate (chip carrier), the junction is called the first level interconnection. When completed, this assembly is referred to as the component, which is then attached to the next circuitry level, i.e. the printed circuit board, the junction being called the second level interconnection. Current developments focus on directly attaching the chip to the board, eliminating one level of packaging and one level of interconnection. As discussed in Chapter 1, pp. 16 and 42–43 of *Microelectronics Packaging Handbook*, Ed. Tummala et al. 1989, interconnections have been made by inserting pins and wires into through holes in cards and soldering. SMT, however, provides increased interconnection density, ceramics even smaller. The limit to the number of interconnections possible is determined in large part by the size of the lands and the density of their spacing. The smaller the lands and the more closely spaced, the more devices can be soldered thereto, whether by soldering pins to lands or by Controlled Collapse Chip Connection (C4) technology, also known as flip-chip joining, wherein solder balls make the land to land connection.

The size of the land is directly related to the solder volume that can be applied thereto. The reliability of the soldered interconnection also bears a direct relation to the solder volume. In high density technology, wherein the land size is decreased due to spacing constraints, the volume of solder that can be applied is minimal. It is difficult or impossible under those constraints to apply enough solder reproducibly to a land in order to form a secure joint between a carrier and a mounted device. On the other hand, too much solder causes joint failure due to smearing and shorting. Particularly in the soldering of high density devices no satisfactory way has been known prior to the present invention to obtain the required volume of solder in a controlled, reproducible way, consistently from land to land. Thus the problem is presented of how strong, reliable solder interconnections can be made to lands which are about 4 to about 6 mils in diameter or even smaller. In addition, in case of misalignment or other such initial soldering problem, rework and repair of the solder joint must be accomplished nondestructively in the presence of organic dielectric materials.

SUMMARY OF THE INVENTION

Accordingly, it is an object of the invention to provide a strong, reliable solder interconnection between a land situated on a major surface of one electronic circuitized device and another electronic device mounted thereon, particularly when the soldering environment includes an organic dielectric material.

It is a further object of the invention to provide a strong, reliable solder interconnection to a land which is nominally as small as 6 mils in diameter, or smaller.

Still another object of the invention is to provide a strong, reliable solder interconnection between lands in a high density environment by increasing the volume of solder that can be accommodated on a land.

The foregoing and other objects and advantages are accomplished in the present invention by means of temporarily increasing the size of the land to be soldered, applying solder to the land positioning the device to be mounted, and reflowing the solder, whereby the metal or alloy by which the size of the land has been increased is dissolved into the solder, causing the solder to contract to the original size of the land. In order to facilitate rework, the solder is preferably a eutectic or other low melting temperature solder, and the metal or alloy by which the size of the land is temporarily increased is preferably of a nature and amount which, when dissolved into the solder, will not raise the melting point of the solder to a temperature at which the integrity of the soldered structure as a whole would be destroyed or impaired during rework.

The invention is broadly applicable to any situation requiring soldering wherein, in order to maximize the strength of a solder joint, the solder volume which can be applied to a discrete area is sought to be increased.

BRIEF DESCRIPTION OF THE DRAWINGS

FIG. 5A should be compared with FIG. 5D.

BRIEF DESCRIPTION OF THE PREFERRED EMBODIMENTS

In order to facilitate understanding of the present invention, reference is made to the following detailed description taken in conjunction with the above described drawings. All measurements are nominal.

Experiments were conducted using wave soldering. Carrier materials included polytetrafluoroethylene (PTFE) dielectric and brominated epoxy dielectric (FR4). High density means not only that the lands are small, but that they are closely spaced. The mounted devices ranged from silicon chips having a 10 mil grid and 3137 lands per chip to chips having 36 lands on 12.8 mil centers.

Figure 1A:
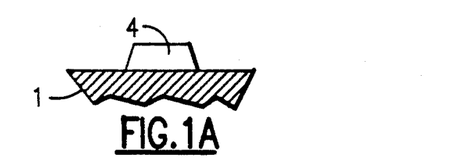
FIGS. 1A, 1B, 1C, 1D, 1E, 1F and 1G illustrate the major process steps of one embodiment of the invention.
Figure 1B:
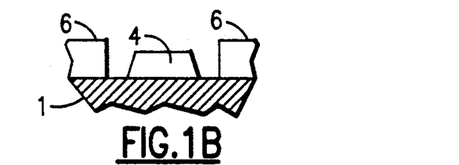
Figure 1C:
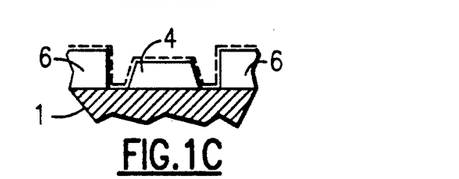
Figure 1D:
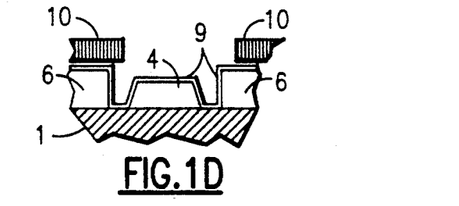
Figure 1E:
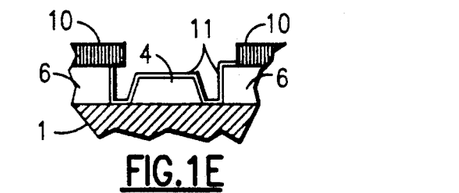
Figure 1F:
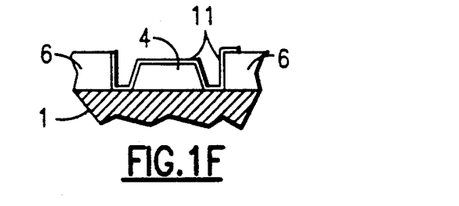
Figure 1G:
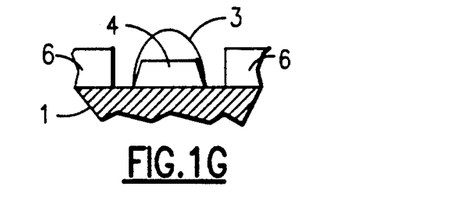

FIG. 1A shows a C4 land 4 on a circuitized card 1. The land, comprised of copper, is nominally 5–6 mils wide and 1.8–2.0 mils high (some may be only 0.5 mils high and 4 mils wide and is positioned on a dielectric material. FIG. 1B illustrates the step in 1A subsequent to the application of a photosensitive resist 6. In the example illustrated, the volume of solder ultimately desired requires that the resist film, in this case Vacrel 8130 solder mask, a photosensitive acrylated epoxy which is a product of E.I. Dupont de Nemours and Company, be 3.0 mils high. The land, and a perimeter around the land, has been exposed and developed in the manner recommended by the manufacturer. FIG. 1C illustrates the step on 1B subsequent to surface roughening at 35 p.s.i. and 1.0 M/min using a vapor blast machine produced by Vapor Blast Manufacturing. Surface roughening was performed in order to improve the adhesion of copper. The copper in the present case was sputtered on a model Z600 sputtering system, a product of Leybold-Heraus, Inc., and was deposited in the manner recommended by the manufacturer. It would also be acceptable to plate the copper rather than sputter it using, at least initially, any of a number of commercially available electroless bath systems such as those provided by Schering and MacDermid, for example. Note that coverage of the copper (a) is over the land itself and extends beyond the land itself to the perimeter area around the land, up the sides of the exposed Vacrel and on the top surface of the Vacrel. It is necessary for the copper to be deposited up the sides of the Vacrel in this manner in order to achieve wetting and penetration of the solder into the hole exposed and developed in the Vacrel. After copper deposition (this copper layer is illustrated with the number 9 in FIG. 1D), a 1.5 mil thick layer of Dupont 9 3115 photoresist 10 was applied and a 9 mil diameter opening was exposed and developed over the 5–6 mil land area, a perimeter around the land and the sides of the Vacrel as shown in FIG. 1D, leaving a 3–4 mil frame around the perimeter of the original land. As shown in FIG. 1E, 30–60 microinches of soft gold 11 was plated over the electroless copper (copper layer 9 is not shown in FIG. 1E). The gold was plated from an electrolytic bath, Pur-A-Gold 125, manufactured by Sel-Rex, and was deposited according to the procedure recommended by the manufacturer. Although gold was used in the illustrated example, other metals or alloys such as tin have been found to be useful as well, and tin in particular has a less deleterious effect on the ultimate melting point of the solder. When gold or palladium is used, the additional benefit is produced of protecting the copper land from oxidation, and storage is then possible if soldering is delayed. The 3115 resist was stripped as shown in FIG. 1F, and 1.2 microns of copper flash etched (this being the copper protected previously by photoresist 10). The temporary effective land size was increased from 5–6 mils to, in the case shown, 9 mils. The land was wave soldered under the following conditions, which resulted in the solder formation 3 seen in FIG. 1G. Using water soluble flux, eutectic tin/lead (nominally 63/37 wt. %) solder was wave soldered using model UPK455 supplied by Electrovert, Inc. When the carrier included a PTFE dielectric, the wave speed was 14.375 ft./min., wave angle was 5.5 degrees and wave temperature was 487.5 degrees F (253 degrees C). When the carrier included a brominated epoxy dielectric, wave speed was 12.25–14.125 ft./min., wave angle was 4.0–5.5 degrees and wave temperature was 512–525 degrees F (267–274 degrees C). (Wave soldering is discussed generally in the aforementioned Chapter 19 of Principles of Electronic Packaging).

Other low temperature solders may alternatively be used, such as eutectic Tin/Bismuth (52/48 wt. %) at about 138 degrees C to about 168 degrees C.

Figure 2A:
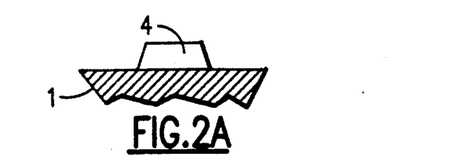
FIGS. 2A, 2B, 2C, 2D, 2E, 2F and 2G illustrate the major process steps of a second embodiment of the invention.
Figure 2B:
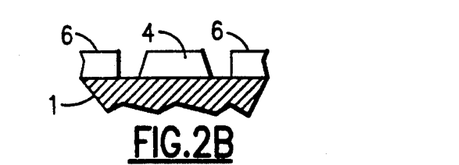
Figure 2C:
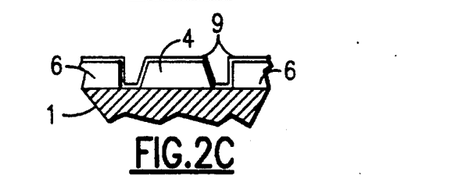
Figure 2D:
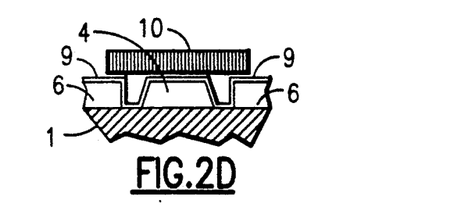
Figure 2E:
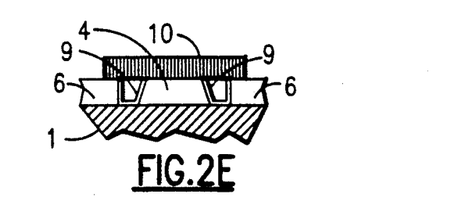
Figure 2F:
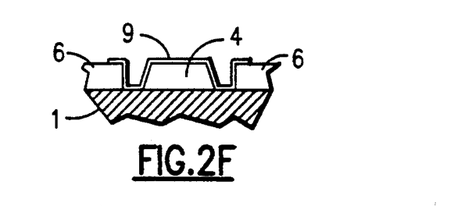
Figure 2G:
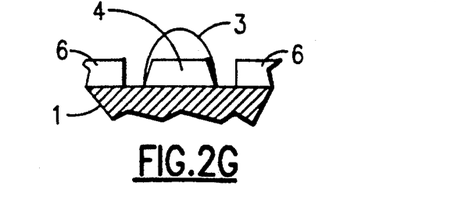
Figure 3A:
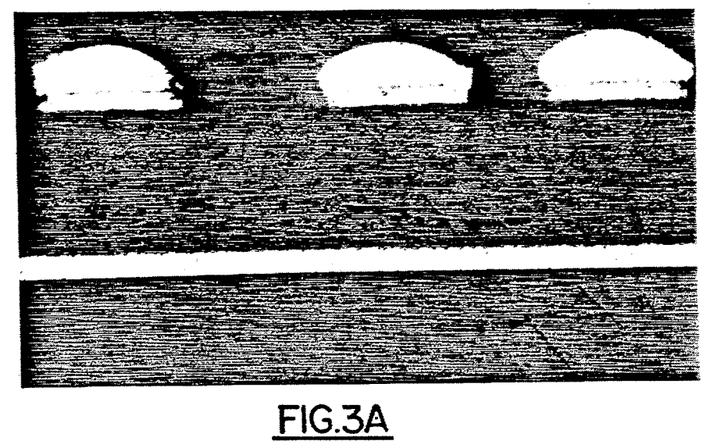
FIGS. 3A, 3B, 3C and 3D illustrate cross-sections of increased volumes of solder on lands following processing by a method of the invention.
Figure 3B:
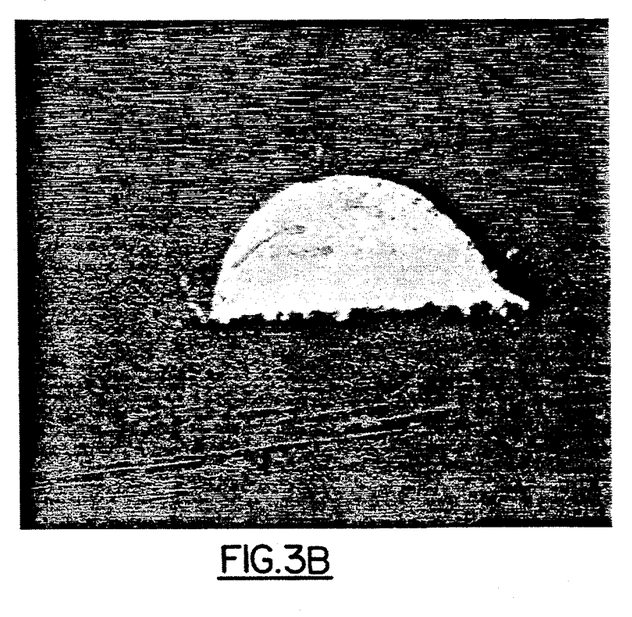
Figure 3C:
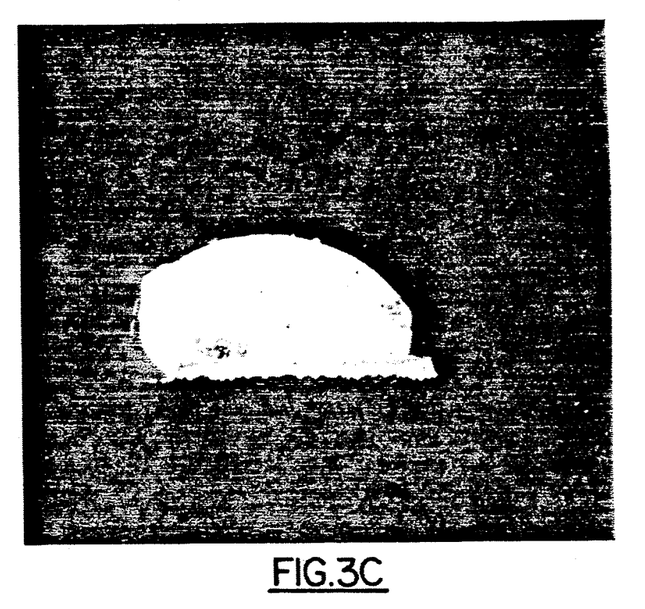
Figure 3D:
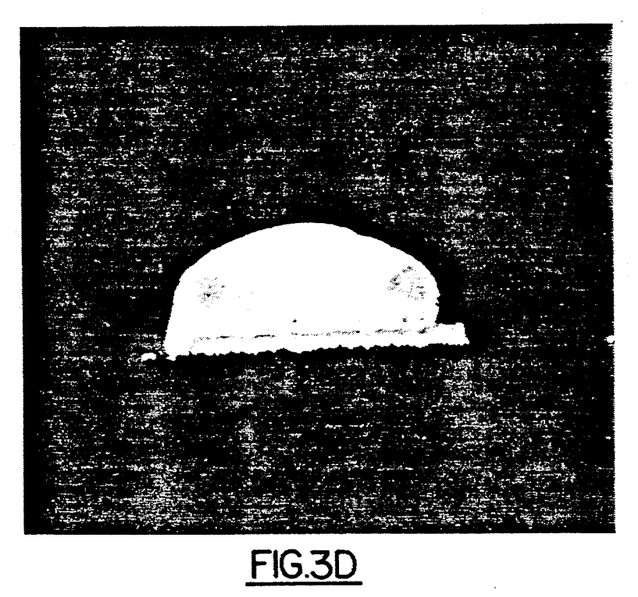

In a second procedure, illustrated in FIGS. 2A–2G, a circuitized card 1 provided with C4 lands 4 of about 4 to about 6 mils in diameter and about 1.8 to about 2.0 mils high as shown in FIG. 2A was covered with Probimer (6), an epoxy based solder mask by Ciba Geigy. The land and the perimeter immediately surrounding the land was exposed and developed as shown in FIG. 2B. After vapor blasting to improve adhesion, shown in FIG. 2C, about 2.4 microns of electroless copper 9 was deposited overall. (Later work optimized the electroless Cu at 1.2 microns.) Dupont 3115 photoresist 10 was applied, exposed and developed such that a circle of the photoresist about 9 mils in diameter remained covering the land and perimeter, shown in FIG. 2B. Copper unprotected by the photoresist was flash etched in persulfate solution comprising 120 g/l sodium persulfate and 2% H2SO4 by volume as shown in FIG. 2E. The remaining photoresist was stripped, exposing the copper 9 remaining on the land, the perimeter around the land, walls of the Probimer solder mask and the rim of the top surface of the Probimer, creating a temporarily extended diameter of about 9 mils, shown in FIG. 2F. During wave soldering, the electroless copper dissolved into the molten eutectic Sn/Pb solder, which then retracted to the original land dimensions, as shown in FIG. 2G.

After passing through the wave, the solder 9 wet the entire area covered by electrolessly deposited copper and dissolved the copper. In so doing the copper-containing solder retracted from the dielectric areas that had been temporarily extended by the copper, remaining only on the land itself. The process described above, wherein the area of the land is temporarily enlarged, then soldered, results in a volume of solder on the land which is about 2-3 times greater than that possible without the temporary enlargement. A device may thus be attached at a solder joint having increased solder volume and improved strength and reliability. As seen in FIGS. 3A, 3B, 3C and 3D the solder volume and solder height from land to land across a circuitized card is consistent, which is an improvement over electrolytic deposition of solder wherein the volume and height distribution from land to land is subject to the vagaries of current distribution effects. The present process also eliminates several extra steps required in electrolytic solder deposition resulting in greater process efficiency and lower cost. The solder deposited from the wave is also of higher purity than electrolytically deposited solder. The optimized process is for the solder to wet the copper, but not dissolve it. When the card is subsequently reflowed, the solder will dissolve the copper and pull back, resulting in maximum solder height.

After chip join (Vapor Phase, produced by HTC Co., using FC-70 solvent from 3M Co. at 215 to 225 degrees C and 5 ft./min.), no opens were detected. Pull strength tests were conducted using an Instron Model 1123 by gluing a stud to the top of a chip with Eastman 910 and pulling at a controlled rate until the solder joint failed. On a typical wave soldered prior art joint the pull strength is about 1.2 to about 2.4 pounds. Electroplated eutectic Sn/Pb solder typically exhibited 3-4 pound pull strength. However, the joints of the present invention exhibited a pull strength of between 5.405 and 5.065 pounds. In addition, the prior art solder height typically produced by wave solder on a land 5-6 mil in diameter is 0.72-0.87 mils, whereas the solder height produced according to the method illustrated in FIGS. 1A through 1G was 2.6 mils and that produced according to the method illustrated in FIGS. 2A through 2G was 1.3 mils, showing a 2-3-fold increase in height over conventional soldering process. Follow-on work with a C4 of 5.5 mil and a wave soldered land of 7.5 mil diameter resulted in a 2.15 mil solder height of optimal uniformity.

Figure 4A:
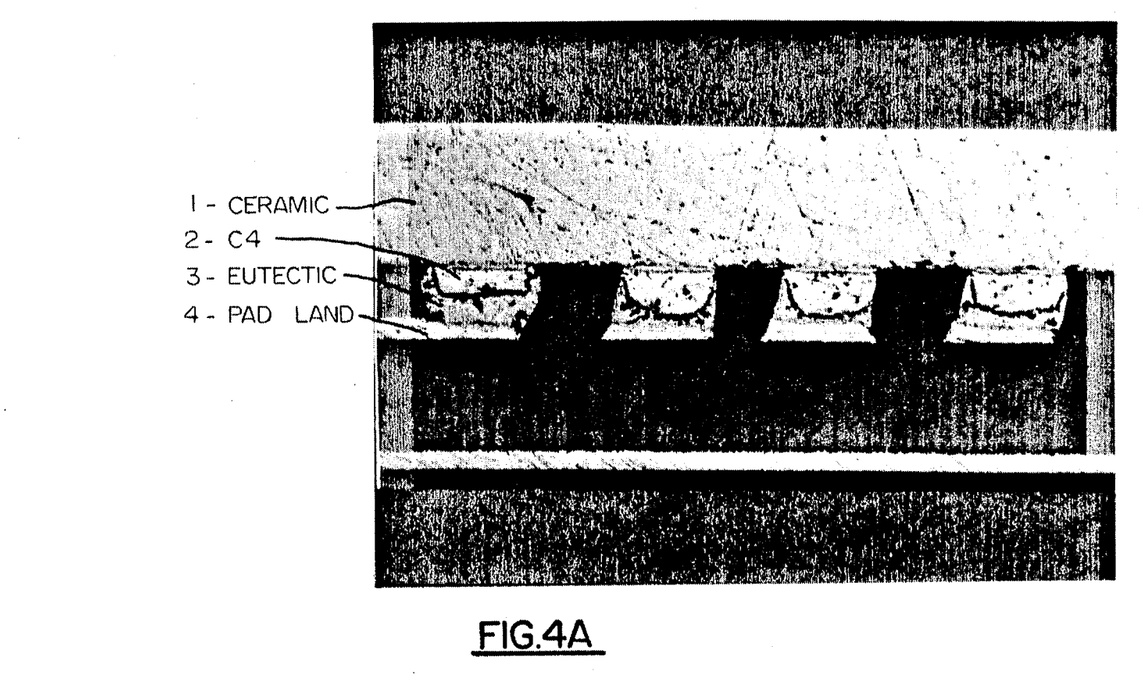
FIGS. 4A, 4B and 4C illustrate Scanning Electron Micrograph (SEM) cross sections depicting the increased solder volume obtained using the invention versus the poorer solder deposition depicted in FIG. 4F and FIG. 4E without the invention.
Figure 4B:
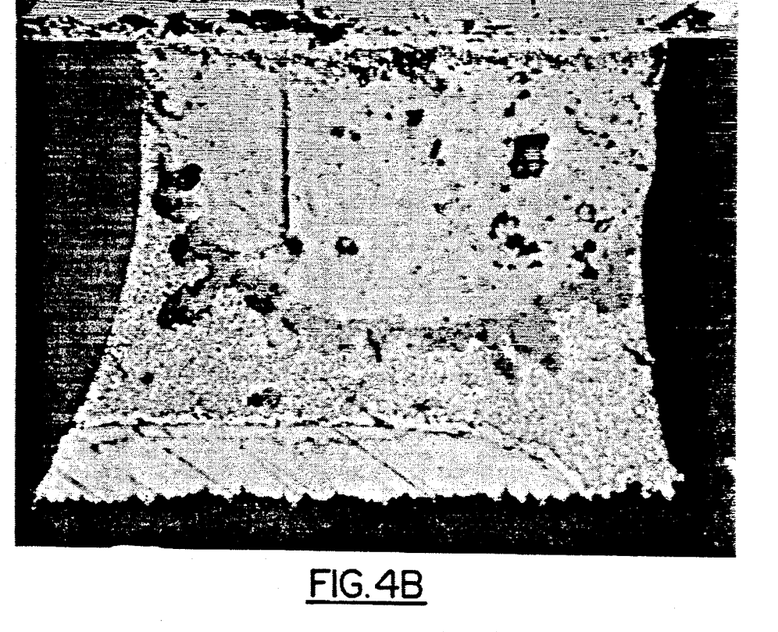
Figure 4C:
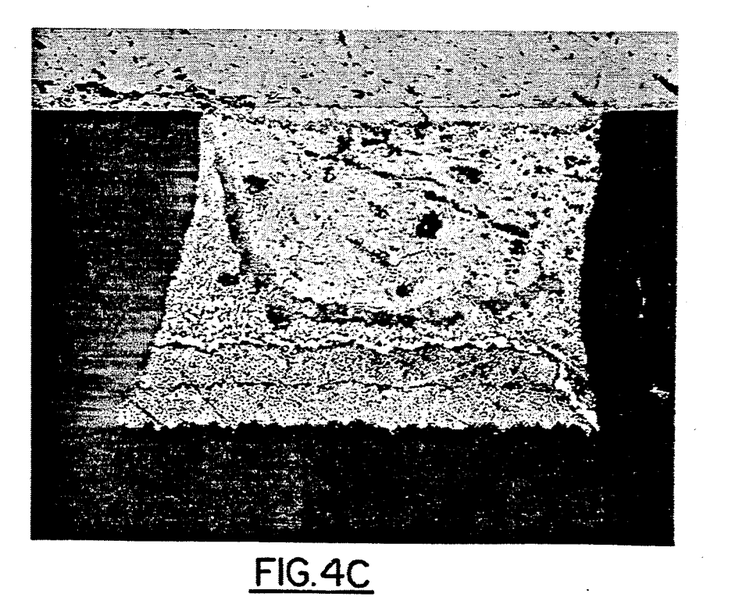
Figure 4D:
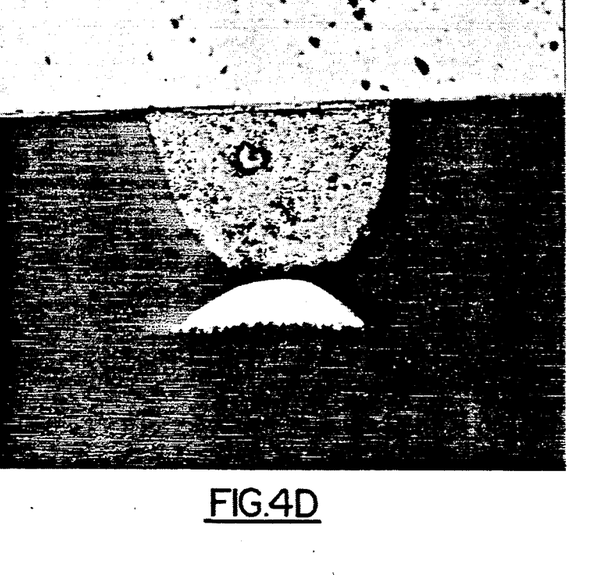
FIGS. 4D and 4E illustrate typical results when the method of the invention is not used. The result is low solder volume and a poor joint.
Figure 4E:
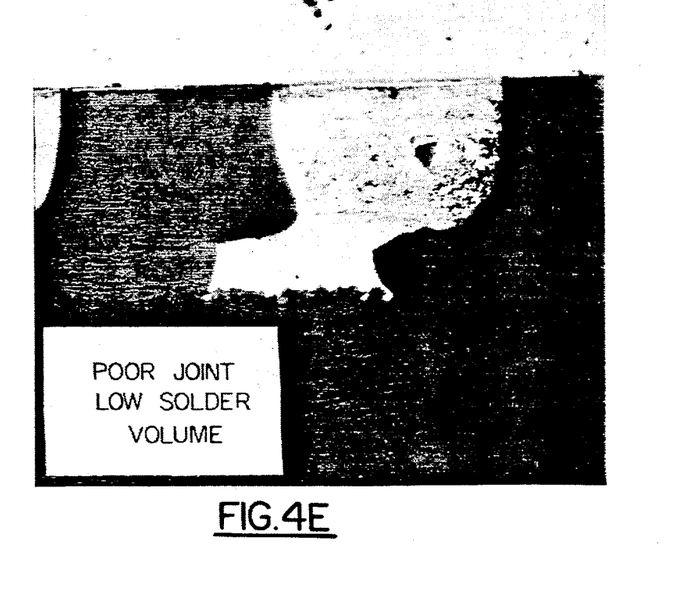

The SEMs shown as FIGS. 4A, 4B and 4C are typical of results obtained using the present invention and are in contrast to the results typically obtained by the prior art method shown in FIGS. 4D and 4E. The mounted ceramic chip is at the top of each SEM; the C4 joint 2 is seen as the rounded area atop the ceramic; the eutectic is seen as surrounding the C4; the pad/land area 4 to which the eutectic is joined is seen as the flat surface down.

Figure 5A:
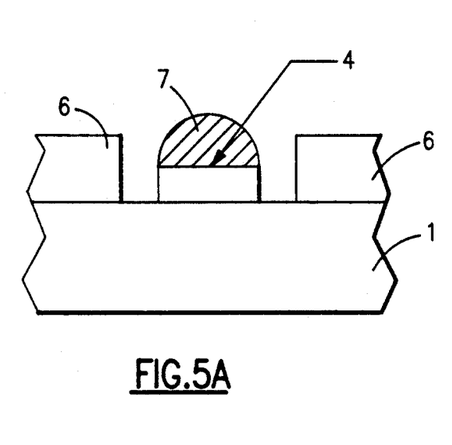
FIG. 5A shows a land which has been soldered by a method of the prior art.
Figure 5B:
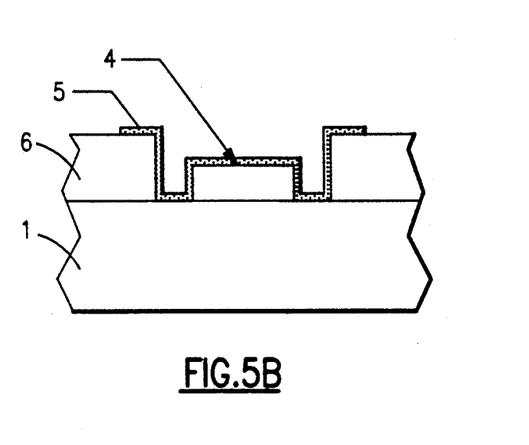
FIGS. 5B, 5C and 5D show the process stages of the present invention.
Figure 5C:
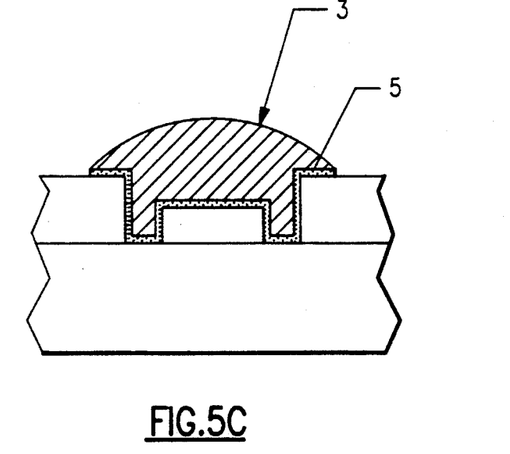
Figure 5D:
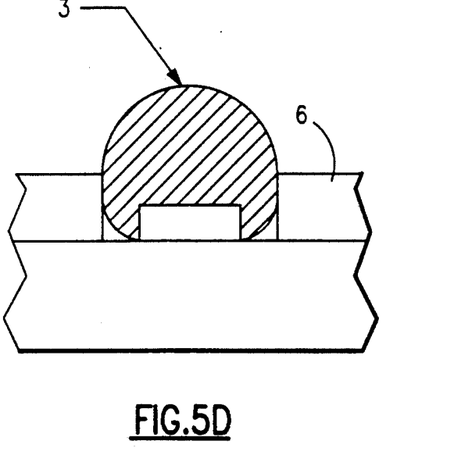

FIG. 5A shows substrate on which is disposed solder mask 6 and C4 land 4. Solder has been applied to land 4 by prior art wave solder means. FIG. 5B shows land 4, the area immediately surrounding which has been temporarily extended by metal deposition to form extended land in the practise of the process of the invention. FIG. 5C shows the extended land which has been provided with solder by wave soldering. FIG. 5D shows land 4 after reflow of solder. Temporary land 5 has been dissolved into solder, whereby the resultant solder solution has retracted from the non-wettable regions to form a high volume solder joint. The surface to which the high volume solder is joined is not shown. The method of the invention may be referred to as "enhanced wave soldering".

In order to reduce the amount of gold, copper or other metal or alloy used to temporarily extend the land area and which is introduced into the solder, an additional embodiment of the invention was prepared using immersion tin over the electroless copper temporary extension. The bath used was Cuposit LT-26 by Shipley, Inc. and it was deposited according to the instructions of the manufacturer. Immersion tin is a replacement, aka displacement, process rather than an electroless, aka autocatalytic, process. Therefore if the electroless copper thickness is initially 50 microinches, for example, and an immersion tin layer of 25 microinches is deposited thereon, the result would be a dual layer comprised of 25 microinches of copper under 25 microinches of tin, still enough metal to provide additional metallurgy at the solder joint. During the reflow soldering process thereafter, the immersion tin layer as well as the electroless copper layer dissolve into the solder. Because excessive amounts of copper in solder raises the melting point but excess tin does not, by substituting at least part of the copper with tin, the amount of copper available to raise the melting point of the solder is reduced. It is important to keep the melting point of the solder low so that any necessary rework can be accomplished at nondestructive temperatures. The presence of a tin layer over the electroless copper also improves the solder wettability.

Whereas wave soldering has been discussed in conjunction with a high density circuit environment, specifically for direct chip attach packages using C4 technology, the process is also applicable to other soldering techniques and other environments. It is also understood that the invention may be embodied in modifications of the present invention forms without departing from the spirit or central characteristics thereof. The aforementioned examples and embodiments are therefore to be considered in all respects as illustrative rather than restrictive, and the invention is not to be limited to the details given herein.

What is claimed is:

1. A method of providing solder on an electrically conductive metallic land located on the surface of a dielectric substrate, said method comprising:

providing a dielectric substrate having an electrically conductive metallic land of a first width located on a surface thereof;

applying a quantity of solder mask material onto said surface of said dielectric substrate at a spaced distance from said conductive metallic land to define a perimeter area on said surface of said dielectric substrate around said land;

depositing a first layer of metal or alloy onto said conductive metallic land, said perimeter area and at least part of said solder mask material;

applying, exposing and developing a quantity of photoresist material onto said first layer of metal such that said photoresist material does not cover the portion of said first layer of metal located on said conductive metallic land and said perimeter area, said portion of said first layer of metal having a second with greater than said first width of said metallic land;

depositing a second layer of solder-dissolvable metal or alloy onto said portion of said first metal not covered by said photoresist material such that said solder-dissolvable metal or alloy will have a width equal to said second width;

removing said photoresist;

applying a quantity of molten solder onto said deposited second layer of solder-dissolvable metal or alloy to cause said solder-dissolvable metal or alloy to become dissolved into said molten solder such that the resulting solder solution, including both said solder and said solder-dissolvable metal or alloy, will contract to substantially only said first width of said conductive metallic land; and cooling said contracted solder solution to substantially solidify said solder.

2. The method of claim wherein said first layer of metal or alloy is applied by sputtering, displacement or electroless techniques.

3. The method of claim further including the steps of mounting an electronic device onto said solidified solder and heating said solidified solder to affix said electronic device thereto.

4. The method of claim wherein said quantity of solder is applied using a wave soldering operation.

5. The method of claim further including the step of roughening said conductive metallic land, said perimeter area and said at least part of said solder mask material prior to said depositing of said first layer of metal.

6. A method of providing solder on an electrically conductive metallic land located on the surface of a dielectric substrate, said method comprising:

providing a dielectric substrate having an electrically conductive metallic land of a first width located on a surface thereof;

applying a quantity of solder mask material onto said surface of said dielectric substrate at a spaced distance from said conductive metallic land to define a perimeter area on said surface of said dielectric substrate around said land;

depositing a layer of solder-dissolvable metal or alloy onto said conductive metallic land, said perimeter area and at least part of said solder mask material;

applying, exposing and developing a quantity of photoresist material onto said layer of solder-dissolvable metal or alloy such that said photoresist material substantially covers the portion of said layer of solder-dissolvable metal or alloy located on said conductive metallic land and said perimeter area whereby said covered portion of said solder-dissolvable metal or alloy will have a second width greater than first width of said conductive metallic land;

removing said layer of solder-dissolvable metal or alloy not covered by said photoresist material;

removing said photoresist material;

applying a quantity of molten solder onto said remaining deposited layer of solder-dissolvable metal or alloy to cause the said solder-dissolvable metal or alloy to become dissolved into said molten solder such that the resulting solder solution, including both said solder and said solder-dissolvable metal or alloy, will contract to substantially only said first width of said conductive metallic land; and cooling said contracted solder solution to substantially solidify said solder.

7. The method of claim 6 wherein said layer of solder-dissolvable metal or alloy is applied by sputtering, displacement or electroless techniques.

8. The method of claim 6 further including the steps of mounting an electronic device onto said solidified solder and heating said solidified solder to affix said electronic device thereto.

9. The method of claim 6 wherein said quantity of solder is applied using a wave soldering operation.

10. The method of claim 6 further including the step of roughening said conductive metallic land, said perimeter area and said at least part of said solder mask material prior to said depositing of said layer of solder-dissolvable metal.

* * * * *